(12) United States Patent
Takamoto et al.

(10) Patent No.: US 8,692,389 B2
(45) Date of Patent: Apr. 8, 2014

(54) DICING TAPE-INTEGRATED FILM FOR SEMICONDUCTOR BACK SURFACE

(75) Inventors: Naohide Takamoto, Osaka (JP); Takeshi Matsumura, Osaka (JP); Goji Shiga, Osaka (JP)

(73) Assignee: Nitto Denko Corporation, Osaka (JP)

( * ) Notice: Subject to any disclaimer, the term of this patent is extended or adjusted under 35 U.S.C. 154(b) by 412 days.

(21) Appl. No.: 12/976,112

(22) Filed: Dec. 22, 2010

(65) Prior Publication Data

US 2011/0156280 A1 Jun. 30, 2011

(30) Foreign Application Priority Data

Dec. 24, 2009 (JP) .................. 2009-292769
Nov. 11, 2010 (JP) .................. 2010-253088

(51) Int. Cl.
*H01L 23/48* (2006.01)
*H01L 21/44* (2006.01)

(52) U.S. Cl.
USPC .................. 257/778; 257/783; 438/118

(58) Field of Classification Search
USPC .................. 438/118; 257/782, 783, E21.599, 257/E21.214; 428/40.1, 41.8, 343, 345, 428/346, 354
See application file for complete search history.

(56) References Cited

U.S. PATENT DOCUMENTS

| | | | |
|---|---|---|---|
| 7,060,339 B2 | 6/2006 | Matsumura et al. | |
| 7,309,925 B2 | 12/2007 | Matsumura et al. | |
| 7,429,522 B2 * | 9/2008 | Matsumura et al. | 438/462 |
| 7,646,103 B2 | 1/2010 | Matsumura et al. | |
| 7,820,487 B2 | 10/2010 | Teshirogi et al. | |
| 7,935,574 B2 | 5/2011 | Saiki et al. | |
| 8,178,420 B2 | 5/2012 | Matsumura et al. | |
| 2002/0192463 A1 * | 12/2002 | Kiuchi et al. | 428/343 |
| 2003/0081817 A1 * | 5/2003 | Nakaigawa et al. | 382/118 |
| 2004/0224117 A1 * | 11/2004 | Amano | 428/40.1 |
| 2005/0046042 A1 | 3/2005 | Matsumura et al. | |
| 2005/0139973 A1 * | 6/2005 | Matsumura et al. | 257/678 |
| 2006/0079011 A1 * | 4/2006 | Tandy et al. | 438/14 |
| 2006/0102987 A1 | 5/2006 | Saiki et al. | |
| 2006/0148131 A1 | 7/2006 | Matsumura et al. | |
| 2008/0019078 A1 * | 1/2008 | Arimitsu et al. | 361/321.2 |
| 2008/0088036 A1 | 4/2008 | Matsumura et al. | |

(Continued)

FOREIGN PATENT DOCUMENTS

| | | |
|---|---|---|
| CN | 1638092 A | 7/2005 |
| JP | 2004063551 A | 2/2004 |

(Continued)

OTHER PUBLICATIONS

Communication from the Japanese Patent Office dated Apr. 3, 2013, in a counterpart application No. 2010-253088.

(Continued)

*Primary Examiner* — Hsien Ming Lee
(74) *Attorney, Agent, or Firm* — Sughrue Mion, PLLC

(57) ABSTRACT

The present invention provides a dicing tape-integrated film for semiconductor back surface, which includes: a dicing tape including a base material and a pressure-sensitive adhesive layer provided on the base material; and a film for flip chip type semiconductor back surface provided on the pressure-sensitive adhesive layer, in which a peel force (temperature: 23° C., peeling angle: 180°, tensile rate: 300 mm/min) between the pressure-sensitive adhesive layer of the dicing tape and the film for flip chip type semiconductor back surface is from 0.05 N/20 mm to 1.5 N/20 mm.

5 Claims, 2 Drawing Sheets

(56) References Cited

U.S. PATENT DOCUMENTS

| | | | |
|---|---|---|---|
| 2008/0090085 A1* | 4/2008 | Kawate et al. | 428/413 |
| 2009/0186451 A1 | 7/2009 | Teshirogi et al. | |
| 2010/0021668 A1* | 1/2010 | Shimokawa et al. | 428/40.2 |
| 2010/0093155 A1 | 4/2010 | Matsumura et al. | |
| 2010/0193967 A1* | 8/2010 | Takamoto | 257/778 |
| 2012/0088333 A1 | 4/2012 | Matsumura et al. | |

FOREIGN PATENT DOCUMENTS

| | | | |
|---|---|---|---|
| JP | 2004072108 A | 3/2004 | |
| JP | 2004-134689 A | 4/2004 | |
| JP | 2004142430 A | 5/2004 | |
| JP | 2004214288 A | 7/2004 | |
| JP | 2004221169 A | 8/2004 | |
| JP | 2004260190 A | 9/2004 | |
| JP | 2005-033170 A | 2/2005 | |
| JP | 2006-140348 A | 6/2006 | |
| JP | 2007158026 A | 6/2007 | |
| JP | 2007250970 A | 9/2007 | |
| JP | 2007261035 A | 10/2007 | |
| JP | 2008006386 A | 1/2008 | |
| JP | 2008-047926 A | 2/2008 | |
| JP | 2008-066688 A | 3/2008 | |
| JP | 2008-124141 A | 5/2008 | |
| JP | 2008-153587 A | 7/2008 | |
| JP | 2008166451 A | 7/2008 | |
| JP | 2009-130320 A | 6/2009 | |
| WO | 2008/038345 A1 | 4/2008 | |

OTHER PUBLICATIONS

Third Party Submission dated Apr. 5, 2013, in a counterpart application No. 2010-253088.

Communication, dated Aug. 16, 2013, issued by the Japanese Patent Office, in counterpart Application No. 2010253088.

Office Action issued by the State Intellectual Property Office of the People's Republic of China dated Jul. 15, 2013 in Corresponding Application No. 201010621812.

Office Action drafted Aug. 28, 2013, issued by the Japan Patent Office in corresponding Japanese Application No. 2010-253088.

Office Action, dated Jan. 16, 2014, issued by the Taiwanese Patent Office in counterpart Taiwanese Application No. 099145899.

Office Action, dated Nov. 27, 2013, issued by the Japanese Patent Office in counterpart Japanese Application No. 2010-253088.

* cited by examiner

DICING TAPE-INTEGRATED FILM FOR SEMICONDUCTOR BACK SURFACE

FIELD OF THE INVENTION

The present invention relates to a dicing tape-integrated film for semiconductor back surface. A film for flip chip type semiconductor back surface is used for protecting a back surface of a chip-shaped workpiece (such as a semiconductor chip) and enhancing strength. Moreover, the invention relates to a semiconductor device using the dicing tape-integrated film for semiconductor back surface and a process for producing the device.

BACKGROUND OF THE INVENTION

Recently, thinning and miniaturization of a semiconductor device and its package have been increasingly demanded. Therefore, as the semiconductor device and its package, those in which a semiconductor chip (chip-shaped workpiece) is fixed to a substrate in a form where a circuit face of the semiconductor chip is opposed to an electrode-formed face of the substrate (i.e., semiconductor chip produced by flip chip bonding, or a flip chip-mounted semiconductor device) have been widely utilized. In such a semiconductor device or the like, the back surface of the semiconductor chip (chip-shaped workpiece) is protected with a protective film to inhibit the damage of the semiconductor chip in some cases (see, for example, Patent Documents 1 to 10).

Patent Document 1 JP-A-2008-166451
  Patent Document 2: JP-A-2008-006386
  Patent Document 3: JP-A-2007-261035
  Patent Document 4: JP-A-2007-250970
  Patent Document 5: JP-A-2007-158026
  Patent Document 6: JP-A-2004-221169
  Patent Document 7: JP-A-2004-214288
  Patent Document 8: JP-A-2004-142430
  Patent Document 9: JP-A-2004-072108
  Patent Document 10: JP-A-2004-063551

SUMMARY OF THE INVENTION

However, the attachment of a back surface protective film for protecting a back surface of a semiconductor chip to the back surface of a semiconductor chip obtained by dicing a semiconductor wafer in a dicing step results in the addition of a step for the attachment, so that the number of steps increases and cost and the like increase. Moreover, owing to the thinning in recent years, the semiconductor chip may be damaged in some cases in a picking-up step of the semiconductor chip after the dicing step. Thus, it is desired to reinforce the semiconductor wafer or semiconductor chip until the picking-up step.

The present invention has been devised in consideration of the foregoing problem and an object thereof is to provide a dicing tape-integrated film for semiconductor back surface capable of being utilized from the dicing step of the semiconductor wafer to the flip chip bonding step of the semiconductor chip. Moreover, another object of the invention is to provide a dicing tape-integrated film for semiconductor back surface capable of exhibiting an excellent holding force in the dicing step of the semiconductor wafer, capable of peeling the semiconductor chip formed by dicing from a pressure-sensitive adhesive layer of a dicing tape with an excellent picking-up property together with the film for flip chip type semiconductor back surface in the picking-up step after the dicing step, and further capable of exhibiting an excellent appearance property after the flip chip bonding step of the semiconductor chip.

As a result of intensive investigations for solving the above-mentioned conventional problems, the present inventors have found that, when a film for flip chip type semiconductor back surface is laminated on a pressure-sensitive adhesive layer of a dicing tape having a base material and the pressure-sensitive adhesive layer to form the dicing tape and the film for flip chip type semiconductor back surface in an integrated fashion and further a peel force (or an adhesive force) between the film for flip chip type semiconductor back surface and the pressure-sensitive adhesive layer of the dicing tape is set at a specific value, the laminate (dicing tape-integrated film for semiconductor back surface) where the dicing tape and the film for flip chip type semiconductor back surface are formed in an integrated fashion can be utilized from the dicing step of the semiconductor wafer to the flip chip bonding step of the semiconductor chip as well as an excellent holding force can be exhibited in the dicing step of the semiconductor wafer, the semiconductor chip formed by dicing can be peeled from the pressure-sensitive adhesive layer of the dicing tape with, an excellent picking-up property together with the film for flip chip type semiconductor back surface in the picking-up step after the dicing step, and an excellent appearance property can be exhibited after the flip chip bonding step of the semiconductor chip, thereby accomplishing the invention.

Namely, the present invention provides a dicing tape-integrated film for semiconductor back surface, comprising:

a dicing tape comprising a base material and a pressure-sensitive adhesive layer formed on the base material; and a film for flip chip type semiconductor back surface formed on the pressure-sensitive adhesive layer of the dicing tape, wherein a peel force (temperature: 23° C., peeling angle: 180°, tensile rate: 300 mm/min) between the pressure-sensitive adhesive layer of the dicing tape and the film for flip chip type semiconductor back surface is from 0.05 N/20 mm to 1.5 N/20 mm.

As above, the dicing tape-integrated film for semiconductor back surface according to the invention is formed in a form where the film for flip chip type semiconductor back surface is integrated with the dicing tape having the base material and the pressure-sensitive adhesive layer, and a peel force (temperature: 23° C., peeling angle: 180°, tensile rate: 300 mm/min) between the pressure-sensitive adhesive layer of the dicing tape and the film for flip chip type semiconductor back surface is from 0.05 N/20 mm to 1.5 N/20 mm. Therefore, by attaching the dicing tape-integrated film for semiconductor back surface onto a workpiece (semiconductor wafer) at dicing a wafer (semiconductor wafer), the workpiece can be effectively diced while being held. Also, after the workpiece is diced to form a chip-shaped workpiece (semiconductor chip), the chip-shaped workpiece can be easily peeled from the pressure-sensitive adhesive layer of the dicing tape with an excellent picking-up property together with the film for flip chip type semiconductor back surface, and the back surface-protected chip-shaped workpiece can be easily obtained. In addition, the chip-shaped workpiece has an excellent appearance property since a film for flip chip type semiconductor back surface is attached to the back surface of the chip-shaped workpiece with an excellent close adhesiveness. Needless to say, since the chip-shaped workpiece has a film for flip chip type semiconductor back surface formed on the back surface, a marking property of the back surface is good.

Furthermore, in the dicing tape-integrated film for semiconductor back surface according to the invention, since the dicing tape and the film for flip chip type semiconductor back surface are formed in an integrated fashion as mentioned above, the film for flip chip type semiconductor back surface can also be attached at the time when the dicing tape is attached to the back surface of the semiconductor wafer before the dicing step and thus a step of attaching the film for flip chip type semiconductor back surface alone (film for flip chip type semiconductor back surface-attaching step) is not necessary. In addition, in the subsequent dicing step and picking-up step, since the film for flip chip type semiconductor back surface is attached on the back surface of the semiconductor wafer or the back surface of the semiconductor chip formed by dicing, the semiconductor wafer or the semiconductor chip can be effectively protected and thus the damage of the semiconductor chip can be suppressed or prevented in the dicing step or subsequent steps (picking-up step, etc.).

In the invention, the film for flip chip type semiconductor back surface is preferably colored. When the film for flip chip type semiconductor back surface is colored, not only a laser marking property is improved but also the dicing tape and the film for flip chip type semiconductor back surface can be easily distinguished from each other, so that workability and the like can be enhanced.

In addition, the film for flip chip type semiconductor back surface preferably has a laser marking property. The dicing tape-integrated film for semiconductor back surface of the invention can be suitably used for a flip chip-mounted semiconductor device, The present invention also provides a process for producing a semiconductor device, the process comprising:

attaching a workpiece onto the film for flip chip type semiconductor back surface of the above-mentioned dicing tape-integrated film for semiconductor back surface, dicing the workpiece to form a chip-shaped workpiece, peeling the chip-shaped workpiece from the pressure-sensitive adhesive layer of the dicing tape together with the film for flip chip type semiconductor back surface, and fixing the chip-shaped workpiece to an adherend by flip chip bonding.

In addition, the invention further provides a flip chip-mounted semiconductor device, which is manufactured using the above-mentioned dicing tape-integrated film for semiconductor back surface, the semiconductor device comprising a chip-shaped workpiece and the film for flip chip type semiconductor back surface attached to a back surface of the chip-shaped workpiece.

Since a dicing tape and a film for flip chip type semiconductor back surface are formed in an integrated fashion as well as a peel force between the pressure-sensitive adhesive layer of the dicing tape and the film for flip chip type semiconductor back surface is set at a specific value, the dicing tape-integrated film for semiconductor back surface of the invention can be utilized from the dicing step of the semiconductor wafer to the flip chip bonding step of the semiconductor chip. Specifically, the dicing tape-integrated film for semiconductor back surface according to the invention can exhibit an excellent holding force in the dicing step of the semiconductor wafer, the semiconductor chip formed by dicing can be peeled from the pressure-sensitive adhesive layer of the dicing tape with an excellent picking-up property together with the film for flip chip type semiconductor back surface in the picking-up step after the dicing step, and also an excellent appearance property can be exhibited during and after the flip chip bonding step of the semiconductor chip. Moreover, in the flip chip bonding step and the like, since the back surface of the semiconductor chip is protected with the film for flip chip type semiconductor back surface, breakage, chipping, warp, and the like of the semiconductor chip can be effectively suppressed or prevented. Needless to say, the dicing tape-integrated film for semiconductor back surface of the invention can effectively exhibit functions thereof in steps other than the steps from the dicing step to the flip chip bonding step of the semiconductor chip.

Figure 1:
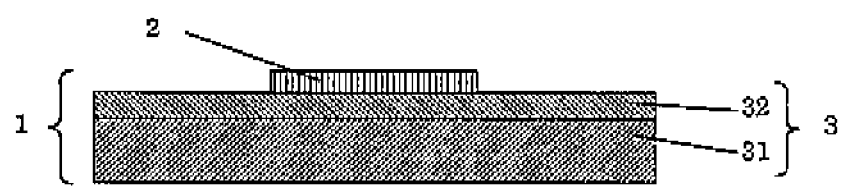
FIG. 1 is a cross-sectional schematic view showing one embodiment of a dicing tape-integrated film for semiconductor back surface according to the invention.

DESCRIPTION OF REFERENCE NUMERALS AND SIGNS 1 dicing tape-integrated film for semiconductor back surface
2 film for flip chip type semiconductor back surface
3 dicing tape
31 base material
32 pressure-sensitive adhesive layer
4 semiconductor wafer (workpiece)
5 semiconductor chip (chip-shaped workpiece)
51 bump formed at circuit face of semiconductor chip 5
6 adherend
61 conductive material for conjunction adhered to connecting pad of adherend 6

DETAILED DESCRIPTION OF THE INVENTION

An embodiment of the present invention is described with reference to FIG. 1 but the invention is not restricted to this embodiment. FIG. 1 is a cross-sectional schematic view showing one embodiment of a dicing tape-integrated film for semiconductor back surface according to the invention. In FIG. 1, 1 is a dicing tape-integrated film for semiconductor back surface (hereinafter sometimes also referred to as "dicing tape-integrated semiconductor back surface protective film", "film for semiconductor back surface with dicing tape", or "semiconductor back surface protective film with dicing tape"), 2 is a film for flip chip type semiconductor back surface (hereinafter sometimes also referred to as "film for semiconductor back surface" or "semiconductor back surface protective film"), 3 is a dicing tape, 31 is a base material, and 32 is a pressure-sensitive adhesive layer.

Incidentally, in the figures in the present specification, parts that are unnecessary for the description are not given, and there are parts shown by magnifying, minifying, etc. in order to make the description easy.

As shown in FIG. 1, the dicing tape-integrated film 1 for semiconductor back surface has a constitution that the film 2 for semiconductor back surface is formed on the pressure-sensitive adhesive layer 32 of the dicing tape 3 including the base material 31 and the pressure-sensitive adhesive layer 32 formed on the base material 31. The film 2 for semiconductor back surface has a property that a peel force (adhesive force or pressure-sensitive adhesive force) between the pressure-sensitive adhesive layer 32 of the dicing tape 3 and the film 2 for semiconductor back surface is from 0.05 N/20 mm to 1.5 N/20 mm in measurement conditions of a temperature of 23° C., a peeling angle of 180°, and a tensile rate of 300 mm/min. In this regard, the surface of the film 2 for semiconductor back surface (surface to be attached to the back surface of the wafer) may be protected with a separator or the like during the period until it is attached to the back surface of the wafer.

Incidentally, the dicing tape-integrated film for semiconductor back surface may have a constitution that the film for semiconductor back surface is formed on the pressure-sensitive adhesive layer of the dicing tape over the whole surface or may have a constitution that the film for semiconductor back surface is partially formed. For example, as shown in FIG. 1, the dicing tape-integrated film for semiconductor back surface may have a constitution that the film for semiconductor back surface is formed, on the pressure-sensitive adhesive layer of the dicing tape, only on the part to which the semiconductor wafer is to be attached.

(Film for Flip Chip Type Semiconductor Back Surface)

The film for semiconductor back surface has a film shape. Since the film for semiconductor back surface has a property that a peel force (temperature: 23° C., peeling angle: 180', drawing rate: 300 mm/min) to the pressure-sensitive adhesive layer of the dicing tape is from 0.05 N/20 mm to 1.5 N/20 mm, in the cut-processing step (dicing step) of cutting a workpiece (semiconductor wafer) attached on the film for semiconductor back surface into a chip shape, the film for semiconductor back surface has a function of supporting the workpiece with close adhesion thereto and thus can exhibit close adhesiveness such that cut pieces are not scattered. Also, in the picking-up step after the dicing step, the diced chip-shaped workpiece can be easily peeled from the dicing tape together with the film for semiconductor back surface. Furthermore, after the picking-up step (after the diced chip-shaped workpiece is peeled from the dicing tape together with the film for semiconductor back surface), since the film for semiconductor back surface is attached to the back surface of the chip-shaped workpiece (semiconductor chip) with an excellent close adhesiveness, the film for semiconductor back surface can have functions of protecting the back surface of the chip-shaped workpiece and also exhibiting an excellent appearance property. Needless to say, a marking property of the back surface of the chip-shaped workpiece is also good.

As mentioned above, since the film for semiconductor back surface has an excellent marking property, marking can be performed to impart various kinds of information such as literal information and graphical information to the face on the non-circuit side of the chip-shaped workpiece or a semiconductor device using the chip-shaped workpiece by utilizing various marking methods such as a printing method and a laser marking method through the film for semiconductor back surface. When the film for semiconductor back surface is colored, by controlling the color of coloring, it becomes possible to observe the information (for example, literal information and graphical information) imparted by marking with excellent visibility.

In particular, since the film for semiconductor back surface has excellent close adhesiveness to the semiconductor wafer or the semiconductor chip, lifting or the like is not observed. Also, since the film for semiconductor back surface can exhibit an excellent appearance property, a semiconductor device having an excellent value-added appearance property can be obtained. For example, as a semiconductor device, it is possible to classify products thereof by using different colors.

Incidentally, as the film for semiconductor back surface, it is important to have close adhesiveness so that cut pieces are not scattered at the cut-processing of the workpiece.

As above, the film for semiconductor back surface is used not for die-bonding a semiconductor chip to an adherend such as a substrate but for protecting the back surface (non-circuit face) of a semiconductor chip to be flip chip mounted (or having been flip chip mounted) and has most suitable function and constitution therefor. In this regard, a die-bonding film to be used in the use application of strongly adhering the semiconductor chip to the adherend such as the substrate is an adhesive layer and is encapsulated with an encapsulating material, so that the film does not have a laser marking layer and also does not have a laser marking property. Therefore, the film for semiconductor back surface in the invention has a function or constitution different from that of a die-bonding film and thus it is not suitable to use the film as a die-bonding film.

As mentioned above, in the invention, it is important for the film for semiconductor back surface that it has a peel force (temperature: 23° C., peeling angle: 180°, tensile rate: 300 mm/min) to the pressure-sensitive adhesive layer of the dicing tape of from 0.05 N/20 mm to 1.5 N/20 mm. Although an upper limit of the peel force (temperature: 23° C., peeling angle: 180°, tensile rate: 300 mm/min) of the film for semiconductor back surface to the pressure-sensitive adhesive layer of the dicing tape may be 1.5 N/20 mm or less, but it is preferably 1.2 N/20 mm or less and more preferably 1 N/20 mm or less. On the other hand, although a lower limit of the peel force (temperature: 23° C., peeling angle: 180°, tensile rate: 300 mm/min) of the film for semiconductor back surface to the pressure-sensitive adhesive layer of the dicing tape may be 0.05 N/20 mm or more, but it is preferably 0.08 N/20 mm or more and more preferably 0.1 N/20 mm or more. Accordingly, the peel force (temperature: 23° C., peeling angle: 180°, tensile rate: 300 mm/min) between the film for semiconductor back surface and the pressure-sensitive adhesive layer of the dicing tape may be from 0.08 N/20 mm to 1.2 N/20 mm and may also be from 0.1 N/20 mm to 1 N/20 mm.

Incidentally, in the case where the film for semiconductor back surface is formed of a resin composition containing a thermosetting resin as mentioned below, the thermosetting resin is usually in an uncured or partially cured state, so that the peel force of the film for semiconductor back surface to the pressure-sensitive adhesive layer of the dicing tape is usually a peel force where the thermosetting resin is in an uncured or partially cured state.

The peel force of the film for semiconductor back surface to the pressure-sensitive adhesive layer of the dicing tape (peel force between the film for semiconductor back surface and the pressure-sensitive adhesive layer of the dicing tape) (temperature: 23° C., peeling angle: 180', tensile rate: 300 mm/min) is a value (N/20 mm-width) measured by forming a dicing tape-integrated film for semiconductor back surface having a film for semiconductor back surface formed on the pressure-sensitive adhesive layer of the dicing tape and peeling the film for semiconductor back surface under conditions of a temperature of 23° C., a peel angle of 180° and a tensile rate of 300 mm/min by using a peel tester (a trade name: AUTOGRAPH AGS-J, manufactured by Shimadzu Corporation) at an interface between the film for semiconductor back surface and the pressure-sensitive adhesive layer of the dicing tape.

The peel force of the film for semiconductor back surface to the pressure-sensitive adhesive layer of the dicing tape can be controlled by the kind and content of the constituting resin component, the kind and content of a crosslinking agent, the kind and content of a filler, and the like.

In the invention, the film for semiconductor back surface can be formed of a resin composition and is preferably constituted by a resin composition containing a thermoplastic resin and a thermosetting resin. In this regard, the film for semiconductor back surface may be constituted by a thermoplastic resin composition using no thermosetting resin or may be constituted by a thermosetting resin composition using no thermoplastic resin.

Examples of the thermoplastic resin include natural rubber, butyl rubber, isoprene rubber, chloroprene rubber, ethylene-vinyl acetate copolymers, ethylene-acrylic acid copolymers, ethylene-acrylic acid ester copolymers, polybutadiene resins, polycarbonate resins, thermoplastic polyimide resins, polyimide resins such 6-Nylon and 6,6-Nylon, phenoxy resins, acrylic resins, saturated polyester resins such as PET (polyethylene terephthalate) and PBT (polybutylene terephthalate), polyamideimide resins, or fluorocarbon resins. The thermoplastic resin may be employed singly or in a combination of two or more kinds. Among these thermoplastic resins, acrylic resins containing only a small amount of ionic impurities, having a high heat resistance, and capable of securing reliability of a semiconductor element are preferable.

The acrylic resins are not particularly restricted, and examples thereof include polymers containing, as component(s), one kind or two or more kinds of esters of acrylic acid or methacrylic acid having a straight chain or branched alkyl group having 30 or less carbon atoms, preferably 4 to 18 carbon atoms. Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid having the alkyl group having 30 or less carbon atoms) are not particularly restricted, and examples thereof include carboxyl group-containing monomers such as acrylic acid, methacrylic acid, carboxylethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate; sulfonic acid-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers such as 2-hydroxyethylacryloyl phosphate.

Such resins may be synthesized according to known methods or commercially available products may be used.

Moreover, examples of the thermosetting resins include epoxy resins and phenol resins as well as amino resins, unsaturated polyester resins, polyurethane resins, silicone resins, and thermosetting polyimide resins. The thermosetting resin may be employed singly or in a combination of two or more kinds. As the thermosetting resin, an epoxy resin containing only a small amount of ionic impurities which corrode a semiconductor element is suitable. Further, the phenol resin is preferably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin or a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins are rich in reactivity with a phenol resin as a curing agent and are superior in heat resistance and the like, The epoxy resins may be synthesized according to known methods, or commercially available products may be used.

Furthermore, the phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are preferable. This is because connection reliability of the semiconductor device can be enhanced.

The phenol resin may be synthesized according to known methods or commercially available products may be used.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

A thermal curing-accelerating catalyst for the epoxy resins and the phenol resins is not particularly restricted and can be suitably selected from known thermal curing-accelerating catalysts and used. The thermal curing-accelerating catalyst may be employed singly or in a combination of two or more kinds. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

In the invention, the film for semiconductor back surface is particularly preferably formed of a resin composition containing an epoxy resin, a phenol resin, and an acrylic resin. Since these resins contain only a small amount of ionic impurities and have a high heat resistance, reliability of the semiconductor element can be secured. The mixing ratio in this case is not particularly restricted but for example, the mixing amount of the epoxy resin and the phenol resin can be suitably selected from the range of 10 to 300 parts by weight based on 100 parts by weight of the acrylic resin, It is important that the film for semiconductor back surface has close adhesiveness to the back surface (non-circuit-formed face) of the semiconductor wafer. Such a film for semiconductor back surface having close adhesiveness can be, for example, formed of a resin composition containing an epoxy resin. For crosslinking, a polyfunctional compound capable of reacting with a functional group or the like at a molecular chain end of the polymer can be added as a crosslinking agent to the film for semiconductor back surface. Owing to this constitution, a close adhesiveness property under high temperature can be enhanced and an improvement of the heat resistance can be achieved.

The crosslinking agent is not particularly restricted and known crosslinking agents can be used. Specifically, examples of the crosslinking agent include not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, and amine-based crosslinking agents. As the crosslinking agent, an isocyanate-based crosslinking agent and an epoxy-based crosslinking agent are suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, as well as epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is, for example, from 0.05 to 7 parts by weight based on 100 parts by weight of the resin component (polymer component) (particularly, a polymer having a functional group at the molecular chain end). When the amount of the crosslinking agent is from 0.05 to 7 parts by weight based on 100 parts by weight of the polymer component, close adhesiveness and a cohesion property can be exhibited at a high level.

In the invention, instead of the use of the crosslinking agent or together with the use of the crosslinking agent, it is also possible to perform a crosslinking treatment by irradiation with an electron beam, ultraviolet light, or the like.

(Coloring Agent)

In the invention, it is preferable that the film for semiconductor back surface is colored. As above, in the case where the film for semiconductor back surface is colored (the case where the film is neither colorless nor transparent), the color shown by coloring is not particularly limited but, for example, is preferably dark color such as black, blue or red color, and black color is more preferable.

In the invention, dark color basically means a dark color having L*, defined in L*a*b* color space, of 60 or smaller (from 0 to 60), preferably 50 or smaller (from 0 to 50), and more preferably 40 or smaller (from 0 to 40).

Moreover, black color basically means a black-based color having L*, defined in L*a*b* color space, of 35 or smaller (from 0 to 35), preferably 30 or smaller (from 0 to 30), and more preferably 25 or smaller (from 0 to 25). In this regard, in the black color, each of a* and b*, defined in the L*a*b* color space, can be suitably selected according to the value of L*. For example, both of a* and b* are within the range of preferably from −10 to 10, more preferably from −5 to 5, and further preferably −3 to 3 (particularly 0 or about 0).

In the invention, L*, a*, and b* defined in the L*a*b* color space can be determined by a measurement with a color difference meter (a trade name "CR-200" manufactured by Minolta Ltd; color difference meter). The L*a*b* color space is a color space recommended by the Commission Internationale de l'Eclairage (CIE) in 1976, and means a color space called CIE1976(L*a*b*) color space. Also, the L*a*b* color space is defined in Japanese Industrial Standards in JIS Z8729.

At coloring of the film for semiconductor back surface, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly limited and can be suitably selected and used among known pigments.

In particular, when a dye is used as a colorant, the dye becomes in a state that it is homogeneously or almost homogeneously dispersed by dissolution in the film for semiconductor back surface, so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface in the dicing tape-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite (black lead), copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

As the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants.

Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 65; CI, Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as CI Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case that two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

Incidentally, in the case of using a colorant mixture formed by mixing a cyan-colored colorant, a magenta-colored colorant and a yellow-colored colorant as the black-colored colorant, these colorants may be used singly or in a combination of two or more kinds. The mixing ratio (or blending ratio) of the cyan-colored colorant, the magenta-colored colorant and the yellow-colored colorant in the mixed ink composition is not particularly restricted as long as a black-based color (e.g., a black-based color having $L^*$, $a^*$, and $b^*$, defined in $L^*a^*b^*$ color space, within the above ranges) can be exhibited, and may be suitably selected according to the type of each colorant and the like. The contents of the cyan-colored colorant, the magenta-colored colorant and the yellow-colored colorant in the mixed ink composition can be suitably selected, for example, within a range, with respect to the total amount of the colorants, of cyan-colored colorant/magenta-colored colorant/yellow-colored colorant=10% by weight to 50% by weight/10% by weight to 50% by weight/10% by weight to 50% by weight (preferably 20% by weight to 40% by weight/20% by weight to 40% by weight/20% by weight to 40% by weight).

The content of the colorant can be suitably selected from a range of 0.1 to 10% by weight in the resin composition which forms the film for semiconductor back surface (excluding solvent(s)) and is preferably from 0.5 to 8% by weight and more preferably from 1 to 5% by weight.

In this regard, into the film for semiconductor back surface, other additives can be suitably blended according to the necessity. Examples of the other additives include, in addition to a filler, a flame retardant, a silane-coupling agent, and an ion-trapping agent, an extender, an antiaging agent, an antioxidant, and a surfactant.

The filler may be any of an inorganic filler and an organic filler but an inorganic filler is suitable. By blending a filler such as an inorganic filler, imparting of electric conductivity to the film for semiconductor back surface, improvement of the thermal conductivity of the film for semiconductor back surface, control of elastic modulus of the film for semiconductor back surface, and the like can be achieved. In this regard, the film for semiconductor back surface may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. The average particle diameter of the inorganic filler is preferably within the range of 0.1 to 80 μm. The average particle diameter of the inorganic filler can be measured by a laser diffraction-type particle size distribution measurement apparatus.

The blending amount of the filler (e.g., inorganic filler) is preferably 80 parts by weight or less (0 to 80 parts by weight) and more preferably 0 to 70 parts by weight based on 100 parts by weight of the total amount of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface can be, for example, formed by utilizing a commonly used method including mixing a thermosetting resin such as an epoxy resin and/or a thermoplastic resin such as an acrylic resin and optional solvent and other additives to prepare a resin composition, followed by forming it to a film-shaped layer. Specifically, a film-shaped layer as the film for semiconductor back surface can be formed, for example, by a method including applying the resin composition on the pressure-sensitive adhesive layer of the dicing tape; a method including applying the resin composition on an appropriate separator (such as release paper) to form a resin layer and then transferring (transcribing) it on the pressure-sensitive adhesive layer of the dicing tape; or the like.

In this regard, in the case that the film for semiconductor back surface is formed of a resin composition containing a thermosetting resin such as an epoxy resin, the film for semiconductor back surface is in a state where the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the film for semiconductor back surface is completely or almost completely cured.

As above, since the film for semiconductor back surface is in a state where a thermosetting resin is uncured or partially cured even when the film contains the thermosetting resin, the gel fraction of the film for semiconductor back surface is not particularly restricted but is, for example, suitably selected from the range of 50% by weight or less (0 to 50% by weight) and is preferably 30% by weight or less (0 to 30% by weight) and more preferably 10% by weight or less (0 to 10% by weight). The gel fraction of the film for semiconductor back surface can be measured by the following measuring method.

<Gel Fraction Measuring Method>

About 0.1 g of a sample is sampled from the film for semiconductor back surface and precisely weighed (Weight of Sample) and, after the sample is wrapped in a mesh-type sheet, is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (Weight after Immersion and Drying), and then the gel fraction (% by weight) is calculated according to the following equation (a).

$$\text{Gel Fraction (\% by weight)} = [(\text{Weight after Immersion and Drying})/(\text{Weight of Sample})] \times 100 \quad (a)$$

Incidentally, the gel fraction of the film for semiconductor back surface can be controlled by the kind and content of the resin components, the kind and content of the crosslinking agent, heating temperature and heating time, and the like.

In the case that the film for semiconductor back surface is a film-shaped article and is colored, the colored state is not particularly restricted. The film for semiconductor back surface may be, for example, a film-shaped article formed of a resin composition containing a thermoplastic and/or thermosetting resin and a coloring agent and the like or may be a film-shaped article having a constitution that a resin layer formed of a resin composition containing a thermoplastic resin and/or a thermosetting resin and the like and a coloring agent layer are laminated. The coloring agent layer is preferably formed of the colorant and a resin composition containing a thermoplastic resin and/or a thermosetting resin and the like.

In this regard, in the case that the film for semiconductor back surface is a laminate of the resin layer and the coloring agent layer, the film for semiconductor back surface in the laminated form preferably has a form where one resin layer, a coloring agent layer and another resin layer are laminated in this order. In this case, two resin layers at both sides of the coloring agent layer may be resin layers having the same composition or may be resin layers having different compositions.

In the invention, in the case that the film for semiconductor back surface is a film-shaped article formed of a resin composition containing a thermosetting resin such as an epoxy resin, close adhesiveness to a semiconductor wafer can be effectively exhibited.

Incidentally, since cutting water is used in the dicing step of the workpiece (semiconductor wafer), the film for semiconductor back surface absorbs moisture to have a moisture content of a normal state or more in some cases. When flip chip bonding is performed with maintaining such a high moisture content, water vapor remains at the close adhesion interface between the film for semiconductor back surface and the workpiece or its processed body (chip-shaped workpiece) and lifting is generated in some cases. Therefore, as the film for semiconductor back surface, the existence of a layer composed of a core material having a high moisture transparency diffuses water vapor and thus it becomes possible to avoid such a problem. From such a viewpoint, the film for semiconductor back surface may be one in which the layer composed of the core material is laminated at its one surface or both surfaces. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrate, and glass substrates, The thickness of the film for semiconductor back surface is not particularly restricted but can be, for example, suitably selected from the range of about 2 to 200 μm. In the invention, the thickness of the film for semiconductor back surface is preferably about 4 to 160 μm, more preferably about 6 to 100 μm, and further more preferably about 10 to 80 μm. The film for semiconductor back surface may have either form of a single layer and a laminated layer. In the case that the film for semiconductor back surface has a form of the laminated layer, as the laminated layer form, for example, a laminated form composed of a wafer adhesion layer and a laser marking layer can be exemplified. Moreover, between the wafer adhesion layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesion layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking of the back surface of a semiconductor chip.

As the film for semiconductor back surface in the invention, the elastic modulus (tensile storage elastic modulus E') at 23° C. is preferably 1 GPa or more, more preferably 2 GPa or more, and further preferably 3 GPa or more. When the elastic modulus of the film for semiconductor back surface is 1 GPa or more, the attachment of the film for semiconductor back surface to the support (e.g., a top tape or bottom tape in a carrier tape) can be suppressed or prevented at the time when the chip-shaped workpiece is peeled from the pressure-sensitive adhesive layer of the dicing tape together with the film for semiconductor back surface and then the film for semiconductor back surface is placed on the support (e.g., the carrier tape) to perform transportation and the like. In this regard, in the case that the film for semiconductor back surface is formed of a resin composition containing a thermosetting resin, as mentioned above, the thermosetting resin is usually in a uncured or partially cured state, so that the elastic modulus of the film for semiconductor back surface at 23° C. is an elastic modulus at 23° C. in a state that the thermosetting resin is uncured or partially cured.

The elastic modulus (tensile storage elastic modulus E') of the film for semiconductor back surface at 23° C. is determined by preparing a film for semiconductor back surface without lamination onto the dicing tape and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the elastic modulus measured is regarded as the value of the tensile storage elastic modulus E'.

The elastic modulus of the film for semiconductor back surface can be controlled by the kind and content of the resin components (thermoplastic resin and/or thermosetting resin), the kind and content of the filler such as silica filler, and the like.

A light transmittance (visible light transmittance) of the film for semiconductor back surface in a visible light region (wavelength: from 400 nm to 800 nm) is not particularly restricted but is, for example, preferably in the range of not more than 20% (from 0% to 20%), more preferably in the range of not more than 10% (from 0% to 10%), and especially preferably in the range of not more than 5% (from 0% to 5%). When the light transmittance of the film for semiconductor back surface in a visible light region is not more than 20%, the visible light transmits through the film for semiconductor back surface and reaches a semiconductor chip, whereby adverse influences against the semiconductor chip can be diminished.

The visible light transmittance (%) of the film for semiconductor back surface can be controlled by the kind and content of the resin components constituting the film for semiconductor back surface, the kind and content of a coloring agent (for example, a pigment and a dye), the kind and content of a filler and the like.

The visible light transmittance (%) can be, for example, calculated in the following manner. That is, the film for semiconductor back surface having a thickness (average thickness) of 20 μm is prepared without being laminated on the dicing tape. Next, the film for semiconductor back surface is irradiated with visible light using "ABSORPTION SPECTRO PHOTOMETER" (a trade name of Shimadzu Corporation). The visible light has a wavelength of from 400 nm to 800 nm. The light intensity of the visible light which has transmitted through the film for semiconductor back surface by this irradiation can be calculated according to the following expression.

Visible light transmittance (%)=[(Light intensity of visible light after transmitting through the film for semiconductor back surface)/(initial light intensity of visible light)]×100

The foregoing calculation method of the light transmittance (%) can also be applied to the calculation of a light transmittance (%) of a film for semiconductor back surface whose thickness is not 20 μm. Specifically, in accordance with the Lambert-Beer law, an absorbance $A_{20}$ in the case of the thickness of 20 μm can be calculated as follows.

$$A_{20} = \alpha \times L_{20} \times C \quad (1)$$

(In the formula, $L_{20}$ is a length of light path, $\alpha$ is an absorbance index, C is a concentration of sample.)

In addition, an absorbance $A_X$ in the case of the thickness of X (μm) can be calculated as follows.

$$A_X = \alpha \times L_X \times C \quad (2)$$

Moreover, absorbance $A_{20}$ in the case of the thickness of 20 μm can be calculated as follows.

$$A_{20} = -\log_{10} T_{20} \quad (3)$$

(In the formula, $T_{20}$ is a light transmittance in the case of the thickness of 20 μm).

From the formulae (1) to (3) above, absorbance $A_X$ can be represented by the following formula.

$$A_X = A_{20} \times (L_X/L_{20}) = -[\log_{10}(T_{20})] \times (L_X/L_{20})$$

Therefore, a light transmittance $T_X$(%) in the case of the thickness of X μm can be calculated as follows:

$$T_X = 10^{-A_X}$$

wherein $A_X = -[\log_{10}(T_{20})] \times (L_X/L_{20})$.

Also, the fact that the thickness of the film for semiconductor back surface in the foregoing calculation method of a light transmittance (%) is regulated to 20 μm does not particularly restrict the thickness of the film for semiconductor back surface of the invention. The value of "20 μm" is a thickness employed for the sake of convenience at the measurement.

In the invention, the film for semiconductor back surface preferably has a low moisture absorbance. Specifically, as the film for semiconductor back surface, the moisture absorbance when the film is allowed to stand under an atmosphere of temperature of 85° C. and humidity of 85% RH for 168 hours is preferably 1% by weight or less and more preferably 0.8% by weight or less. By regulating the moisture absorbance of the film for semiconductor back surface (after standing under an atmosphere of temperature of 85° C. and humidity of 85% RH for 168 hours) to 1% by weight or less, the laser marking property can be enhanced. Moreover, for example, the generation of voids can be suppressed or prevented in the reflow step. The moisture absorbance of the film for semiconductor back surface can be regulated, for example, by changing the amount of the inorganic filler to be added. The moisture absorbance (% by weight) of the film for semiconductor back surface is a value calculated from a weight change when the film is allowed to stand under an atmosphere of temperature of 85° C. and humidity of 85% RH for 168 hours (see the following expression). In the case that the film for semiconductor back surface is formed of a resin composition containing a thermosetting resin, the moisture absorbance of the film for semiconductor back surface is a value calculated from a weight change when the film is allowed to stand under an atmosphere of a temperature of 85° C. and a humidity of 85% RH for 168 hours after thermal curing.

Moisture absorbance (% by weight)=[{(Weight after allowing the colored film for semiconductor back surface to stand)−(Weight before allowing the colored film for semiconductor back surface to stand)}/(Weight before allowing the colored film for semiconductor back surface to stand)]×100

Moreover, in the invention, the film for semiconductor back surface preferably has a small ratio of volatile matter. Specifically, as the film for semiconductor back surface, the ratio of weight decrease (weight decrease ratio) after heating at a temperature of 250° C. for 1 hour is preferably 1% by weight or less and more preferably 0.8% by weight or less. By regulating the weight decrease ratio of the film for semiconductor back surface (after heating at a temperature of 250° C. for 1 hour) to 1% by weight or less, the laser marking property can be enhanced. Moreover, for example, the generation of cracks in a package can be suppressed or prevented in the reflow step. The weight decrease ratio of the film for semiconductor back surface can be regulated, for example, by adding an inorganic substance capable of reducing the crack generation at lead-free solder reflow, e.g., an inorganic filler such as silica or alumina. The weight decrease ratio (% by weight) of the film for semiconductor back surface is a value calculated from a weight change when the film is heated at 250° C. for 1 hour (see the following expression). In the case that the film for semiconductor back surface is formed of a resin composition containing a thermosetting resin, the weight decrease ratio of the film for semiconductor back surface is a value calculated from a weight change when the film is heated at a temperature of 250° C. for 1 hour after thermal curing.

Weight decrease ratio (% by weight)=[{(Weight before allowing the film for semiconductor back surface to stand)−(Weight after allowing the film for semiconductor back surface to stand)}/(Weight before allowing the film for semiconductor back surface to stand)]×100

The film for semiconductor back surface is preferably protected by a separator (release liner, not shown in figures). The separator has a function as a protective material for protecting the film for semiconductor back surface until it is practically used. Moreover, the separator can be further used as a supporting base material at the time when the film for semiconductor back surface is transferred to the pressure-sensitive adhesive layer on the base material of the dicing tape. The separator is peeled when attaching a workpiece onto the film for semiconductor back surface of the dicing tape-integrated film for semiconductor back surface. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be fanned by a conventionally known method. Moreover, the thickness or the like of the separator is not particularly restricted.

(Dicing Tape)

The dicing tape includes a base material and a pressure-sensitive adhesive layer formed on the base material. Thus, the dicing tape sufficiently has a constitution that the base material and the pressure-sensitive adhesive layer are laminated. The base material (supporting base material) can be used as a supporting material for the pressure-sensitive adhesive layer and the like. As the base material, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins. Moreover, as the material of the base material, a polymer such as a cross-linked body of each of the above resins can also be used. These raw materials may be employed singly or in a combination of two or more kinds.

In the case that a plastic base material is used as the base material, deformation properties such as an elongation degree may be controlled by a stretching treatment or the like.

The thickness of the base material is not particularly restricted and can be appropriately selected depending on strength, flexibility, intended purpose of use, and the like. For example, the thickness is generally 1000 μm or less (e.g., 1 to 1000 μm), preferably 10 to 500 μm, further preferably 20 to 300 μm, and further preferably about 30 to 200 μm but is not limited thereto. In this regard, the base material may have any form of a single layer form and a laminated layer form.

A commonly used surface treatment, e.g., an oxidation treatment by a chemical or physical treatment such as a chromate treatment, ozone exposure, flame exposure, exposure to high-voltage electric shock, or an ionized radiation treatment, or a coating treatment with an undercoating agent may be applied onto the surface of the base material, in order to enhance close adhesiveness with the adjacent layer, holding properties, etc.

Incidentally, the base material may contain various additives (a coloring agent, a filler, a plasticizer, an antiaging agent, an antioxidant, a surfactant, a flame retardant, etc.) within the range where the advantages and the like of the invention are not impaired.

The pressure-sensitive adhesive layer is formed of a pressure-sensitive adhesive and has pressure-sensitive adhesiveness. Such a pressure-sensitive adhesive is not particularly restricted and can be suitably selected among known pressure-sensitive adhesives. Specifically, as the pressure-sensitive adhesive, a pressure-sensitive adhesive having the above-mentioned characteristics can be suitably selected and used among known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristic-improving pressure-sensitive adhesives in which a heat-meltable resin having a melting point of about 200° C. or lower is mixed into these pressure-sensitive adhesives (see, e.g., JP-A-56-61468, JP-A-61-174857, JP-A-63-17981, JP-A-56-13040, etc., each of which herein incorporated by reference). Moreover, as the pressure-sensitive adhesives, radiation-curable pressure-sensitive adhesives (or energy ray-curable pressure-sensitive adhesives) or heat-expandable pressure-sensitive adhesives can be also used. The pressure-sensitive adhesive may be employed singly or in a combination of two or more kinds.

In the invention, as the pressure-sensitive adhesive, acrylic pressure-sensitive adhesives and rubber-based pressure-sensitive adhesives can be suitably used and particularly, acrylic pressure-sensitive adhesives are suitable. As the acrylic pressure-sensitive adhesives, there may be mentioned acrylic pressure-sensitive adhesives in which an acrylic polymer (homopolymer or copolymer) using one or two or more kinds of alkyl (meth)acrylates as monomer components is used as the base polymer.

Examples of the alkyl (meth)acrylates in the acrylic pressure-sensitive adhesives include alkyl (meth)acrylates such as methyl (meth)acrylate, ethyl (meth)acrylate, propyl (meth) acrylate, isopropyl (meth)acrylate, butyl (meth)acrylate, isobutyl (meth)acrylate, s-butyl (meth)acrylate, t-butyl (meth)acrylate, pentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth) acrylate, and eicosyl (meth)acrylate. As the alkyl (meth)acrylates, alkyl (meth)acrylates having an alkyl group having 4 to 18 carbon atoms are suitable. Incidentally, the alkyl group of the alkyl (meth)acrylate may be linear or branched.

The above-mentioned acrylic polymer may contain units corresponding to other monomer components (copolymerizable monomer components) polymerizable with the alkyl (meth)acrylates for the purpose of modifying cohesive force, heat resistance, crosslinking ability, and the like. Examples of such copolymerizable monomer components include carboxyl group-containing monomers such as (meth)acrylic acid (acrylic acid or methacrylic acid), carboxyethyl acrylate, carboxypentyl acrylate, itaconic acid, maleic acid, fumaric acid, and crotonic acid; acid anhydride group-containing monomers such as maleic anhydride and itaconic anhydride; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, and (4-hydroxymethylcyclohexyl)methyl methacrylate; sulfonic acid group-containing monomers such as styrenesulfonic acid, allylsulfonic acid, 2-(meth) acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group-containing monomers such as 2-hydroxyethylacryloyl phosphate; (N-substituted)amide-based monomers such as (meth)acrylamide, N,N-dimethyl(meth)acrylamide, N-butyl (meth)acrylamide, N-methylol(meth)acrylamide, and N-methylolpropane(meth)acrylamide; aminoalkyl (meth)acrylate-based monomers such as aminoethyl (meth)acrylate, N,N-dimethylaminoethyl (meth)acrylate, and t-butylaminoethyl (meth)acrylate; alkoxyalkyl (meth)acrylate-based monomers such as methoxyethyl (meth)acrylate and ethoxyethyl (meth) acrylate; cyanoacrylate monomers such as acrylonitrile and methacrylonitrile; epoxy group-containing acrylic monomers such as glycidyl (meth)acrylate; styrene-based monomers such as styrene and α-methylstyrene; vinyl ester-based monomers such as vinyl acetate and vinyl propionate; olefin-based monomers such as isoprene, butadiene, and isobutylene; vinyl ether-based monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, and N-vinylcaprolactam; maleimide-based monomers such as N-cyclohexylmaleimide, N-isopropylmaleimide, N-laurylmaleimide, and N-phenylmaleimide; itaconimide-based monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide-based monomers such as N-(meth)acryloyloxymethylenesuccinimide, N-(meth)acryloyl-6-oxyhexamethylenesuccinimide, and N-(meth)acryloyl-8-oxyoctamethylenesuccinimide; glycol-based acrylic ester monomers such as polyethylene glycol (meth)acrylate, polypropylene glycol (meth)acrylate, methoxyethylene glycol (meth)acrylate, and methoxypolypropylene glycol (meth) acrylate; acrylic acid ester-based monomers having a heterocycle, a halogen atom, a silicon atom, or the like, such as tetrahydrofurfuryl (meth)acrylate, fluorine (meth)acrylate, and silicone (meth)acrylate; polyfunctional monomers such as hexanediol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylolpropane tri(meth)acrylate, pentaerythritol tri(meth)acrylate, dipentaerythritol hexa(meth)acrylate, epoxy acrylate, polyester acrylate, urethane acrylate, divinylbenzene, butyl di(meth)acrylate, and hexyl di(meth)acrylate; and the like. These copolymerizable monomer components may be employed singly or in a combination of two or more kinds.

In the case that a radiation-curable pressure-sensitive adhesive (or an energy ray-curable pressure-sensitive adhesive) is used as a pressure-sensitive adhesive, examples of the radiation-curable pressure-sensitive adhesive (composition) include internal type radiation-curable pressure-sensitive adhesives in which a polymer having a radically reactive carbon-carbon double bond in the polymer side chain or main chain is used as the base polymer, radiation-curable pressure-sensitive adhesives in which a UV curable monomer component or oligomer component is blended into the pressure-sensitive adhesive, and the like. Moreover, in the case that the heat-expandable pressure-sensitive adhesive is used as the pressure-sensitive adhesive, there may be mentioned heat-expandable pressure-sensitive adhesives containing a pressure-sensitive adhesive and a foaming agent (particularly, heat-expandable microsphere); and the like as the heat-expandable pressure-sensitive adhesive.

In the invention, the pressure-sensitive adhesive layer may contain various additives (e.g., a tackifying resin, a coloring agent, a thickener, an extender, a filler, a plasticizer, an anti-aging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. Specific examples of the isocyanate-based crosslinking agents and the epoxy-based crosslinking agents include compounds (specific examples) specifically exemplified in the paragraphs concerning the film for semiconductor back surface. The crosslinking agent may be employed singly or in a combination of two or more kinds. Incidentally, the amount of the crosslinking agent is not particularly restricted.

In the invention, instead of the use of the crosslinking agent or together with the use of the crosslinking agent, it is also possible to perform the crosslinking treatment by irradiation with an electron beam or ultraviolet light.

The pressure-sensitive adhesive layer can be, for example, formed by utilizing a commonly used method including mixing a pressure-sensitive adhesive and optional solvent and other additives and then shaping the mixture into a sheet-like layer. Specifically, the pressure-sensitive adhesive layer can be, for example, formed by a method including applying a mixture containing a pressure-sensitive adhesive and optional solvent and other additives on a base material; a method including applying the above-mentioned mixture on an appropriate separator (such as a release paper) to form a pressure-sensitive adhesive layer and then transferring (transcribing) it on a base material; or the like.

The thickness of the pressure-sensitive adhesive layer is not particularly restricted and, for example, is preferably about 5 to 300 μm, more preferably 5 to 200 μm, further preferably 5 to 100 μm, and even more preferably 7 to 50 μm. When the thickness of the pressure-sensitive adhesive layer is within the above-mentioned range, an appropriate pressure-sensitive adhesive force can be exhibited. The pressure-sensitive adhesive layer may be either a single layer or a multi layer.

Moreover, the thickness of the dicing tape (thickness of the whole tape including the base material and the pressure-sensitive adhesive layer) can be, for example, selected from the range of 6 to 1300 μm, and is preferably 15 to 700 μm, more preferably 25 to 400 μm, and further preferably 37 to 250 μm.

Incidentally, in the invention, the dicing tape-integrated film for semiconductor back surface can be made to have an antistatic function. Owing to this constitution, the circuit can be prevented from breaking down owing to the generation of electrostatic energy at the time of close adhesion (at the time of adhesion) and at the time of peeling thereof or owing to charging of a workpiece (a semiconductor wafer, etc.) by the electrostatic energy. Imparting of the antistatic function can be performed by an appropriate manner such as a method of adding an antistatic agent or a conductive substance to the base material, the pressure-sensitive adhesive layer, and the film for semiconductor back surface or a method of providing a conductive layer composed of a charge-transfer complex, a metal film, or the like onto the base material. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface is preferably non-conductive from the viewpoint of having no electric leakage.

In the invention, the dicing tape may be prepared as mentioned above and used or a commercially available product may be used.

Moreover, the dicing tape-integrated film for semiconductor back surface may be formed in a form where it is wound as a roll or may be formed in a form where the sheet (film) is laminated. For example, in the case that the film has the form where it is wound as a roll, the film for semiconductor back surface may be wound as a roll in a state that the film is protected by a separator according to needs, whereby the film can be prepared as a dicing tape-integrated film for semiconductor back surface in a state or form where it is wound as a roll. In this regard, the dicing tape-integrated film for semiconductor back surface in the state or form where it is wound as a roll may be constituted by the base material, the pressure-sensitive adhesive layer formed on one surface of the base material, the film for semiconductor back surface formed on the pressure-sensitive adhesive layer, and a releasably treated layer (rear surface treated layer) formed on the other surface of the base material.

Incidentally, the thickness of the dicing tape-integrated film for semiconductor back surface (total thickness of the thickness of the film for semiconductor back surface and the thickness of the dicing tape composed of the base material and the pressure-sensitive adhesive layer) can be, for example, selected from the range of 8 to 1500 μm, and it is preferably from 20 to 850 μm, more preferably 31 to 500 μm, and further preferably 47 μm to 330 μm.

In the dicing tape-integrated film for semiconductor back surface, a ratio of the thickness of the film for semiconductor back surface to the thickness of the pressure-sensitive adhesive layer of the dicing tape is not particularly restricted, but it can be, for example, suitably selected from the range of 150/5 to 3/100 in terms of the ratio of (thickness of the film for semiconductor back surface)/(thickness of the pressure-sensitive adhesive layer of the dicing tape). The ratio is preferably from 100/5 to 3/50 and more preferably 60/5 to 3/40. When the ratio of the thickness of the film for semiconductor back surface to the thickness of the pressure-sensitive adhesive layer of the dicing tape is within the above-mentioned range, an appropriate pressure-sensitive adhesive force can be exhibited, and excellent dicing property and picking-up property can be exhibited.

Moreover, in the dicing tape-integrated film for semiconductor back surface, the ratio of the thickness of the film for semiconductor back surface to the thickness of the dicing tape (total thickness of the base material and the pressure-sensitive adhesive layer) is not particularly restricted but can be, for example, appropriately selected from the range of 150/50 to 3/500 in terms of (thickness of the film for semiconductor back surface)/(thickness of the dicing tape), and is preferably 100/50 to 3/300 and more preferably 60/50 to 3/150. When the ratio of the thickness of the film for semiconductor back surface to the thickness of the dicing tape is within the range of 150/50 to 3/500, a picking-up property is good and generation of lateral residue at dicing can be suppressed or prevented.

As above, by controlling the ratio of the thickness of the film for semiconductor back surface to the thickness of the pressure-sensitive adhesive layer of the dicing tape or the ratio of the thickness of the film for semiconductor back surface to the thickness of the dicing tape (total thickness of the base material and the pressure-sensitive adhesive layer) in the dicing tape-integrated film for semiconductor back surface, a dicing property at the dicing step, a picking-up property at the picking-up step, and the like can be improved and the dicing tape-integrated film for semiconductor back surface can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface of the invention is described while using the dicing tape-integrated film 1 for semiconductor back surface as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive layer 32 is formed by applying a pressure-sensitive adhesive composition onto the base material 31, followed by drying (by crosslinking under heating according to needs). Examples of the application method include roll coating, screen coating, and gravure coating. In this regard, the pressure-sensitive adhesive composition may be directly applied onto the base material 31 to form the pressure-sensitive adhesive layer 32 on the base material 31, or the pressure-sensitive adhesive composition may be applied onto a release paper or the like whose surface has been subjected to a releasable treatment to form a pressure-sensitive adhesive layer, which is then transferred onto the base material 31 to form the pressure-sensitive adhesive layer 32 on the base material 31. Thus, a dicing tape 3 is prepared by forming the pressure-sensitive adhesive layer 32 on the base material 31.

On the other hand, a coated layer is formed by applying a forming material for forming the film 2 for semiconductor back surface onto a release paper so as to have a prescribed thickness after drying and further drying under prescribed conditions (in the case that thermal curing is necessary, performing a heating treatment and drying according to needs). The film 2 for semiconductor back surface is formed on the pressure-sensitive adhesive layer 32 by transferring the coated layer onto the pressure-sensitive adhesive layer 32. In this regard, the film 2 for semiconductor back surface can be also formed on the pressure-sensitive adhesive layer 32 by directly applying the forming material for forming the film 2 for semiconductor back surface onto the pressure-sensitive adhesive layer 32, followed by drying under prescribed conditions (in the case that thermal curing is necessary, performing a heating treatment and drying according to needs). Consequently, the dicing tape-integrated film 1 for semiconductor back surface according to the invention can be obtained. Incidentally, in the case that thermal curing is performed at the formation of the film 2 for semiconductor back surface, it is important to perform the thermal curing to such a degree that a partial curing is achieved but preferably, the thermal curing is not performed.

The dicing tape-integrated film for semiconductor back surface of the invention can be suitably used at the production of a semiconductor device including the flip chip bonding step. Namely, the dicing tape-integrated film for semiconductor back surface of the invention is used at the production of a flip chip-mounted semiconductor device and thus the flip chip-mounted semiconductor device is produced in a condition or form where the film for semiconductor back surface of the dicing tape-integrated film for semiconductor back surface is attached to the back surface of the semiconductor chip. Therefore, the dicing tape-integrated film for semiconductor back surface of the invention can be used for a flip chip-mounted semiconductor device (a semiconductor device in a state or form where the semiconductor chip is fixed to an adherend such as a substrate by a flip chip bonding method).

(Semiconductor Wafer)

The workpiece (semiconductor wafer) is not particularly restricted as long as it is a known or commonly used semiconductor wafer and can be appropriately selected and used among semiconductor wafers made of various materials. In the invention, as the semiconductor wafer, a silicon wafer can be suitably used.

(Production Process of Semiconductor Device)

The process for producing a semiconductor device of the invention is not particularly restricted as long as it is a process for producing a semiconductor device using the above-mentioned dicing tape-integrated film for semiconductor back surface. For example, a production process including the following steps and the like process may be mentioned:

a step of attaching a workpiece onto the film for semiconductor back surface of the dicing tape-integrated film for semiconductor back surface (mounting step);

a step of dicing the workpiece to form a chip-shaped workpiece (dicing step);

a step of peeling the chip-shaped workpiece from the pressure-sensitive adhesive layer of the dicing tape together with the film for semiconductor back surface (picking-up step); and a step of fixing the chip-shaped workpiece to an adherend by flip chip bonding (flip chip bonding step).

More specifically, as the process for producing a semiconductor device, for example, a semiconductor device can be produced by using the dicing tape-integrated film for semiconductor back surface of the invention, after the separator optionally provided on the film for semiconductor back surface is appropriately peeled off, as follows. Hereinafter, referring to FIGS. 2A to 2D, the process is described while using, as an example, the case that the dicing tape-integrated film 1 for semiconductor back surface is employed.

FIGS. 2A to 2D are cross-sectional schematic views showing one embodiment of the process for producing a semiconductor device using the dicing tape-integrated film for semiconductor back surface of the invention. In FIGS. 2A to 2D, 4 is a workpiece (semiconductor wafer), 5 is a chip-shaped workpiece (semiconductor chip), 51 is a bump formed at the circuit face of the semiconductor chip 5, 6 is an adherend, 61 is a conductive material for conjunction adhered to a connecting pad of the adherend 6, and 1, 2, 3, 31, and 32 are a dicing tape-integrated film for semiconductor back surface, a film for semiconductor back surface, a dicing tape, a base material, and a pressure-sensitive adhesive layer, respectively, as mentioned above.

(Mounting Step)

Figure 2A:
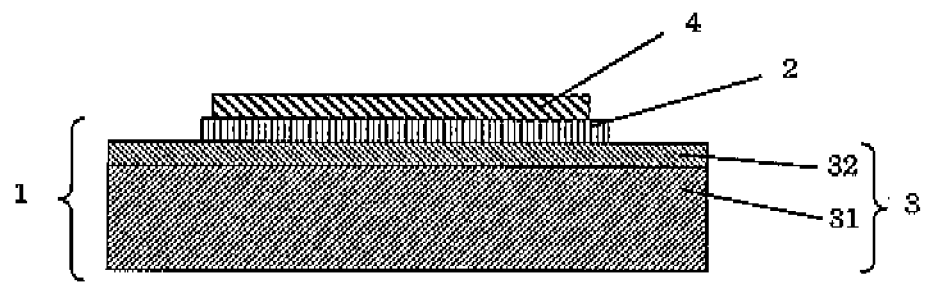
FIGS. 2A to 2D are cross-sectional schematic views showing one embodiment of a process for producing a semiconductor device using a dicing tape-integrated film for semiconductor back surface according to the invention.

First, as shown in FIG. 2A, the semiconductor wafer (workpiece) 4 is attached (press-bonded) onto the film 2 for semiconductor back surface in the dicing tape-integrated film 1 for semiconductor back surface to fix the semiconductor wafer by close adhesion and holding (mounting step). The present step is usually performed while pressing with a pressing means such as a pressing roll, (Dicing Step)

Figure 2B:
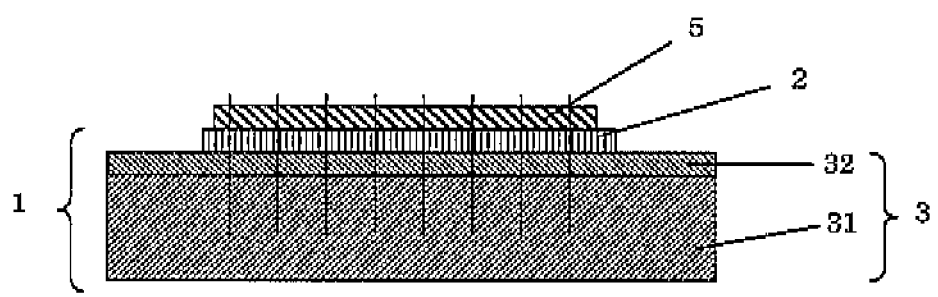

Next, as shown in FIG. 2B, the semiconductor wafer 4 is diced. Consequently, the semiconductor wafer 4 is cut into a prescribed size and individualized (is formed into small pieces) to produce semiconductor chips (chip-shaped workpieces) 5. The dicing is performed according to a normal method from the circuit face side of the semiconductor wafer 4, for example. Moreover, the present step can adopt, for example, a cutting method called full-cut that forms a slit reaching the dicing tape-integrated film 1 for semiconductor back surface. In the invention, it is important that the workpiece is fully cut (completely cut) in the dicing step. On this occasion, it is important that the workpiece is diced together with the film for semiconductor back surface while completely cutting the film for semiconductor back surface. Namely, it is important that the present step is a step of forming a chip-shaped workpiece by dicing the workpiece together with the film for semiconductor back surface. In this regard, at the dicing of the workpiece together with the film for semiconductor back surface, the dicing can be performed in a form where a slit is not formed on the dicing tape or in a form where a slit is formed at least partially also on the dicing tape (preferably partially so that the dicing tape is not cut). The dicing apparatus used in the present step is not particularly restricted, and a conventionally known apparatus can be used. Further, since the semiconductor wafer 4 is adhered and fixed by the dicing tape-integrated film 1 for semiconductor back surface having the film for semiconductor back surface, chip crack and chip fly can be suppressed, as well as the damage of the semiconductor wafer 4 can also be suppressed. In this regard, when the film 2 for semiconductor back surface is formed of a resin composition containing an epoxy resin, generation of adhesive extrusion from the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case that the dicing tape-integrated film for semiconductor back surface is expanded, the expansion can be performed using a conventionally known expanding apparatus. The expanding apparatus has a doughnut-shaped outer ring capable of pushing the dicing tape-integrated film for semiconductor back surface downward through a dicing ring and an inner ring which has a diameter smaller than the outer ring and supports the dicing tape-integrated film for semiconductor back surface. Thanks to the expanding step, it is possible to prevent the damage of adjacent semiconductor chips through contact with each other in the picking-up step to be mentioned below.

(Picking-Up Step)

Figure 2C:
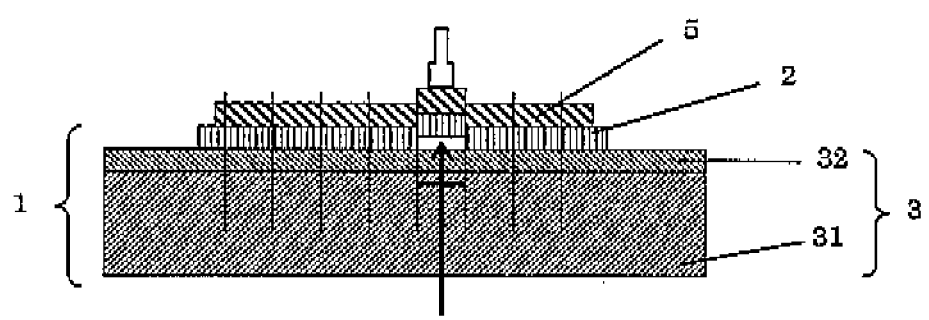

In order to collect the semiconductor chip 5 that is adhered and fixed to the dicing tape-integrated film 1 for semiconductor back surface, picking-up of the semiconductor chip 5 is performed as shown in FIG. 2C to peel the semiconductor chip 5 together with the film 2 for semiconductor back surface from the dicing tape 3. The method of picking-up is not particularly restricted, and conventionally known various methods can be adopted. For example, there may be mentioned a method including pushing up each semiconductor chip 5 from the base material 31 side of the dicing tape-integrated film 1 for semiconductor back surface with a needle and picking-up the pushed semiconductor chip 5 with a picking-up apparatus. In this regard, the picked-up semiconductor chip 5 has been protected with the film 2 for semiconductor back surface at the back surface (also referred to as a non-circuit face, a non-electrode-formed face, etc.).

(Flip Chip Bonding Step)

Figure 2D:
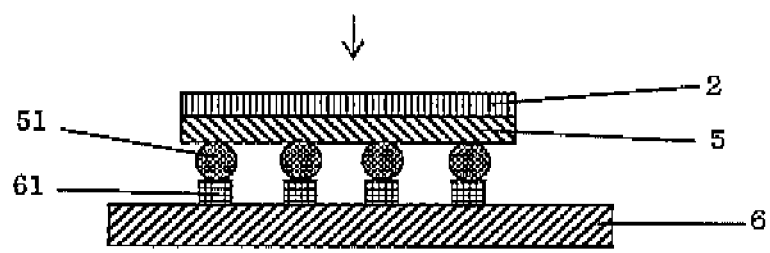

As shown in FIG. 2D, the picked-up semiconductor chip 5 is fixed to an adherend such as a substrate by a flip chip bonding method (flip chip mounting method). Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face of the semiconductor chip 5 is brought into contact with a conductive material 61 (such as solder) for conjuction attached to a connecting pad of the adherend 6 and the conductive material is melted under pressing, whereby electric connection between the semiconductor chip 5 and the adherend 6 can be secured and the semiconductor chip 5 can be fixed to the adherend 6. In this regard, at the fixing of the semiconductor chip 5 to the adherend 6, it is important that the opposing faces of the semiconductor chip 5 and the adherend 6 and the gap are washed in advance and an encapsulating material (such as an encapsulating resin) is then filled into the gap.

As the adherend, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the present step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

Moreover, the washing liquid to be used at washing the opposing face (electrode-formed face) and the gap between the semiconductor chip 5 and the adherend 6 in the flip chip bonding is not particularly restricted and the liquid may be an organic washing liquid or may be an aqueous washing liquid. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

In the invention, the encapsulating material to be used at the encapsulation of the gap between the semiconductor chip 5 and the adherend 6 is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin, in addition to the epoxy resin. Incidentally, a phenol resin can be utilized as a curing agent for the epoxy resin and, as such a phenol resin, there may be mentioned phenol resins exemplified in the above.

In the encapsulation step with the encapsulating resin, the encapsulating resin is usually cured by heating to achieve encapsulation. The curing of the encapsulating resin is usually carried out at 175° C. for 60 to 90 seconds in many cases. However, in the invention, without limitation thereto, the curing may be performed at a temperature of 165 to 185° C. for several minutes, for example. In the case that the film for semiconductor back surface is formed of a resin composition containing a thermosetting resin, the thermosetting resin constituting the film for semiconductor back surface can be completely or almost completely cured at the curing of the encapsulating resin.

The distance of the gap between the semiconductor chip 5 and the adherend 6 is generally from about 30 to about 300 p.m.

In the semiconductor device (flip chip-mounted semiconductor device) produced using the dicing tape-integrated film for semiconductor back surface of the invention, since the film for semiconductor back surface is attached on the back surface of the chip-shaped workpiece, laser marking can be applied with excellent visibility. Particularly, the marking can be applied with an excellent contrast ratio and thus it is possible to observe various kinds of information (literal information, graphical information, etc.) applied by laser marking with a good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the flip chip-mounted semiconductor device produced using the dicing tape-integrated film for semiconductor back surface of the invention is a semiconductor device mounted by the flip chip mounting method, the device has a thinned and miniaturized shape as compared with a semiconductor device mounted by a die-bonding mounting method. Thus, the flip chip-mounted semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred examples of the invention in detail. However, the materials, the blending amount, and the like described in these examples are not intended to limit the scope of the invention to only those unless otherwise stated, and they are merely explanatory examples. Moreover, part in each example is a weight standard unless otherwise stated.

Example 1

<Manufacture of Film for Semiconductor Back Surface>

113 parts of an epoxy resin (a trade name "EPICOAT 1004" manufactured by TER Co., Ltd.), 121 parts of a phenol resin (a trade name "MILEX XLC-4L" manufactured by Mitsui Chemicals, Inc.), 246 parts of sphere silica (a trade name "SO-25R" manufactured by Admatechs Co., Ltd., average particle diameter: 0.5 μm), 5 parts of a dye 1 (a trade name "OIL GREEN 502" manufactured by Orient Chemical Industries Co., Ltd.), and 5 parts of a dye 2 (a trade name "OIL BLACK BS" manufactured by Orient Chemical Industries Co., Ltd.) based on 100 parts of an acrylic acid ester-based polymer (a trade name "PARACRON W-197CM" manufactured by Negami Chemical Industrial Co., Ltd.) having ethyl acrylate and methyl methacrylate as main components were dissolved into methyl ethyl ketone to prepare a resin composition solution having a solid concentration of 23.6% by weight.

The resin composition solution was applied onto a releasably treated film as a release liner (separator) composed of a polyethylene terephthalate film having a thickness of 50 μm, which had been subjected to a silicone-releasing treatment, and then dried at 130° C. for 2 minutes to manufacture a film A for semiconductor back surface having a thickness (average thickness) of 20 μm.

<Manufacture of Dicing Tape-Integrated Film for Semiconductor Back Surface>

The above film A for semiconductor back surface was attached on the pressure-sensitive adhesive layer of a dicing tape (a trade name "V-8-S" manufactured by Nitto Denko Corporation; average thickness of base material: 65 μm, average thickness of pressure-sensitive adhesive layer: 10 μm) using a hand roller to manufacture a dicing tape-integrated film for semiconductor back surface.

Example 2

<Manufacture of Film for Semiconductor Back Surface>

A film A for semiconductor back surface having a thickness (average thickness) of 20 μm was manufactured in the same manner as in Example 1.

<Manufacture of Dicing Tape-Integrated Film for Semiconductor Back Surface>

The above film A for semiconductor back surface was attached on the pressure-sensitive adhesive layer of a dicing tape (a trade name "V-8-T" manufactured by Nitto Denko Corporation; average thickness of base material: 65 μm, average thickness of pressure-sensitive adhesive layer: 10 μm) using a hand roller to manufacture a dicing tape-integrated film for semiconductor back surface.

Comparative Example 1

Manufacture of Film for Semiconductor Back Surface

A film A for semiconductor back surface having a thickness (average thickness) of 20 μm was manufactured in the same manner as in Example 1.

<Manufacture of Dicing Tape-Integrated Film for Semiconductor Back Surface>

The above film A for semiconductor back surface was attached on the pressure-sensitive adhesive layer of a dicing tape (a trade name "V-8-M" manufactured by Nitto Denko Corporation; average thickness of base material: 65 μm, average thickness of pressure-sensitive adhesive layer: 10 μm) using a hand roller to manufacture a dicing tape-integrated film for semiconductor back surface.

Comparative Example 2

<Manufacture of Film for Semiconductor Back Surface>

A film A for semiconductor back surface having a thickness (average thickness) of 20 μm was manufactured in the same manner as in Example 1.

<Manufacture of Dicing Tape>

In a reaction vessel fitted with a cooling tube, a nitrogen inlet tube, a thermometer, and a stirring apparatus were placed 86.4 parts of 2-ethylhexyl acrylate, 13.6 parts of 2-hydroxyethyl acrylate, 0.2 part of benzoyl peroxide, and 65 parts of toluene, and the whole was subjected to a polymerization treatment in a nitrogen stream at 61° C. for 6 hours to obtain an acrylic polymer A.

To the acrylic polymer A was added 14.6 parts of 2-methacryloyloxyethyl isocyanate, and the whole was subjected to an addition reaction treatment in an air stream at 50° C. for 48 hours to obtain an acrylic polymer A'.

Then, 8 parts of a polyisocyanate compound (a trade name "COLONATE L", manufactured by Nippon Polyurethane Industry Co., Ltd.) and 5 parts of a photopolymerization initiator (a trade name "IRGACURE 651", manufactured by Ciba Specialty Chemicals) were added to 100 parts of the acrylic polymer A' to obtain a pressure-sensitive adhesive composition solution A.

The pressure-sensitive adhesive composition solution A was applied onto a silicone-treated face of a PET release liner (release liner having a form where one surface of a polyethylene terephthalate film had been subjected to a silicone treatment), and then dried at 120° C. for 2 minutes to form a pressure-sensitive adhesive layer having a thickness of 10 μm. Then, a polyolefin film was attached onto the formed pressure-sensitive adhesive layer. The polyolefin film has a thickness of 100 μm and comprises a printed layer for shielding radiation rays previously formed on a portion corresponding to a frame-attaching region. Thereafter, the polyolefin film-attached one was heated at 50° C. for 24 hours to perform a crosslinking treatment and further irradiated with an ultraviolet light at an illuminance of 20 mW/cm from the polyolefin film side by means of an ultraviolet irradiation apparatus (a trade name "UM-810") manufactured by Nitto Seiki Co., Ltd. so that an accumulated light amount becomes 400 mJ/cm$^2$, thereby manufacturing a dicing tape A.

<Manufacture of Dicing Tape-Integrated Film for Semiconductor Back Surface>

The film A for semiconductor back surface was attached on the pressure-sensitive adhesive layer of the above dicing tape A using a hand roller to manufacture a dicing tape-integrated film for semiconductor back surface.

Incidentally, in the dicing tape-integrated films for semiconductor back surface according to Examples 1 and 2, the thickness (average thickness) of the film for semiconductor back surface is 20 μm. Moreover, with regard to the dicing tapes (a trade names "V-8-S" and "V-8-T" all manufactured by Nitto Denko Corporation), the thickness (average thickness) of the base material is 65 μm, the thickness (average thickness) of the pressure-sensitive adhesive layer is 10 μm, and the total thickness is 75 μm. Therefore, in the dicing tape-integrated films for semiconductor back surface according to Examples 1 and 2, the ratio of the thickness of the film for semiconductor back surface to the thickness of the pressure-sensitive adhesive layer of the dicing tape (thickness of the film for semiconductor back surface/thickness of the pressure-sensitive adhesive layer of the dicing tape; ratio in average thickness) is 20/10 and the ratio of the thickness of the film for semiconductor back surface to the thickness of the dicing tape (total thickness of the base material and the pressure-sensitive adhesive layer) (thickness of the film for semiconductor back surface/thickness of the dicing tape; ratio in average thickness) is 20/75.

(Measurement of Physical Properties of Film for Semiconductor Back Surface)

With respect to each film A for semiconductor back surface in the dicing tape-integrated film for semiconductor back surface prepared in Examples and Comparative Examples, a visible light transmittance (%), a moisture absorbance (% by weight) and a weight decrease ratio (% by weight) were measured, respectively in the following manners. The results of the measurement are shown in the following Table 1.

<Measuring Method of Visible Light Transmittance>

Each film for semiconductor back surface prepared in Examples and Comparative Examples (average thickness: 20 μm) was irradiated with visible light using "ABSORPTION SPECTRO PHOTOMETER" (a trade name, manufactured by Shimadzu Corporation). A wavelength of the visible light was regulated to from 400 nm to 800 nm. A light intensity of the visible light which had transmitted through the film for semiconductor back surface by this irradiation was measured and calculated according to the following expression.

Visible light transmittance (%)=[(Light intensity of visible light after transmitting through the film for semiconductor back surface)/(Initial light intensity of visible light)]×100

<Measuring Method of Moisture Absorbance>

Each film for semiconductor back surface prepared in Examples and Comparative Examples was allowed to stand in a constant-temperature and constant-humidity chamber at a temperature of 85° C. and a humidity of 85% RH for 168 hours. A weight before and after standing was measured, and a moisture absorbance (% by weight) was calculated according to the following expression.

Moisture absorbance (% by weight)=[{(Weight after allowing the film for semiconductor back surface to stand)−(Weight before allowing the film for semiconductor back surface to stand)}/(Weight before allowing the film for semiconductor back surface to stand)]×100

<Measuring Method of Weight Decrease Ratio>

Each film for semiconductor back surface prepared in Examples and Comparative Examples was allowed to stand in a drying machine at a temperature of 250° C. for 1 hour. A weight before and after standing was measured, and a weight decrease ratio (% by weight) was calculated according to the following expression.

Weight decrease ratio (% by weight)=[{(Weight before allowing the film for semiconductor back surface to stand)−(Weight after allowing the film for semiconductor back surface to stand)}/(Weight before allowing the film for semiconductor back surface to stand)]×100

TABLE 1

|  | Visible light transmittance (%) | Moisture absorbance (% by weight) | Weight decrease ratio (% by weight) |
|---|---|---|---|
| Film for semiconductor back surface A | 1% or less | 0.3 | 0.9 |

(Evaluation)

With regard to each dicing tape-integrated film for semiconductor back surface manufactured in Examples 1 and 2 and Comparative Examples 1 and 2, a peel force between the film for semiconductor back surface and the pressure-sensitive adhesive layer of the dicing tape, a dicing property, a picking-up property, a flip chip bonding property, a marking property of the wafer back surface, and an appearance property of the wafer back surface were evaluated or measured by the following evaluating or measuring method. The results of the evaluation or measurement are shown in Table 2.

<Measuring Method of Peel Force Between Film for Semiconductor Back Surface and Dicing Tape>

With regard to a peel force between the film for semiconductor back surface and the pressure-sensitive adhesive layer of the dicing tape, the film for semiconductor back surface of each dicing tape-integrated film for semiconductor back surface of Examples 1 and 2 and Comparative Examples 1 and 2 was peeled from the dicing tape (i.e., from the pressure-sensitive adhesive layer of the dicing tape) (peeled at an interface between the film for semiconductor back surface and the pressure-sensitive adhesive layer of the dicing tape) at a temperature of 23° C. under conditions of a peel angel of 180° and a tensile rate of 300 mm/min by using a peel tester (a trade name: "AUTOGRAPH AGS-J" manufactured by Shimadzu Corporation) to measure a maximum load of the load at the time of peeling (a maximum value of the load from which a peak top at the beginning of measurement has been eliminated), the maximum load being determined as a peel force between the film for semiconductor back surface and the pressure-sensitive adhesive layer of the dicing tape (adhesive force of the pressure-sensitive adhesive layer of the dicing tape to the film for semiconductor back surface) (adhesive force: N/20 mm-width).

<Evaluating Method of Dicing Property/Picking-Up Property>

Using each dicing tape-integrated film for semiconductor back surface of Examples 1 and 2 and Comparative Examples 1 and 2, the dicing property was evaluated by actually dicing a semiconductor wafer and then peeling ability was evaluated, thus dicing performance or picking-up performance of the dicing tape-integrated film for semiconductor back surface being evaluated.

A semiconductor wafer (diameter: 8 inches, thickness: 0.6 mm; a silicon mirror wafer) was subjected to a back surface polishing treatment and a mirror wafer having a thickness of 0.2 mm was used as a workpiece. After the separator was peeled from the dicing tape-integrated film for semiconductor back surface, the mirror wafer (workpiece) was attached onto the film for semiconductor back surface by roller press-bonding at 70° C. and dicing was further performed. Herein, the dicing was performed as full cut so as to be a chip size of 10 mm square. In this regard, conditions for semiconductor wafer grinding, attaching conditions, and dicing conditions are as follows.

(Conditions for Semiconductor Wafer Grinding)
Grinding apparatus: a trade name "DFG-8560" manufactured by DISCO Corporation Semiconductor wafer: 8 inch diameter (back surface was ground so as to be until a thickness of 0.2 mm from a thickness of 0.6 mm)
(Attaching Conditions)
Attaching apparatus: a trade name "MA-3000III" manufactured by Nitto Seiki Co., Ltd.
Attaching speed: 10 mm/min
Attaching pressure: 0.15 MPa
Stage temperature at the time of attaching: 70° C.
(Dicing Conditions)
Dicing apparatus: a trade name "DFD-6361" manufactured by DISCO Corporation
Dicing ring: "2-8-1" (manufactured by DISCO Corporation)
Dicing speed: 30 mm/sec
Dicing Blade:
  Z1; "2030-SE 27HCDD" manufactured by DISCO Corporation
  Z2; "2030-SE 27HCBB" manufactured by DISCO Corporation
Dicing Blade Rotation Speed:
  Z1; 40,000 r/min
  Z2; 45,000 r/min
Cutting method: step cutting
Wafer chip size: 10.0 mm square In the dicing, it was confirmed whether the mirror wafer (workpiece) was firmly held on the dicing tape-integrated film for semiconductor back surface without peeling to effect the dicing satisfactory or not. The case where the dicing was well performed was ranked "Good" and the case where the dicing was not well performed was ranked "Poor", thus the dicing ability being evaluated.

Next, the chip-shaped workpieces obtained by dicing were peeled from the pressure-sensitive adhesive layer of the dicing tape together with the film for semiconductor back surface by pushing up the workpieces from the dicing tape side of the dicing tape-integrated film for semiconductor back surface with a needle, whereby the chip-shaped workpieces in a state where the back surface had been protected with the film for semiconductor back surface were picked up. The picking-up ratio (%) of the chips (400 pieces in total) on this occasion was determined to evaluate the picking-up property. Therefore, the picking-up property is better when the picking-up ratio is closer to 100%.

Here, the picking-up conditions are as follows.
(Picking-Up Conditions for Semiconductor Wafer)
Picking-up apparatus: a trade name "SPA-300" manufactured by Shinkawa Co., Ltd.
Number of picking-up needles: 9 needles
Pushing-up speed of needle: 20 mm/s
Pushing-up distance of needle: 500 μm
Picking-up time: 1 second
Dicing tape-expanding amount: 3 mm
<Evaluation Method for Flip Chip Bonding Property>

On the chip-shaped workpiece according to each Example or Comparative Example obtained by the above-mentioned <Evaluating method of dicing properties/picking-up property> using the dicing tape-integrated film for semiconductor back surface according to each Example or Comparative Example, a bump formed at the circuit face of the chip-shaped workpiece was brought into contact with a conductive material (solder) for conjunction attached to a connecting pad of the circuit board in a form where the surface (circuit face) of the chip-shaped workpiece was opposed to the surface of the circuit board possessing a wiring corresponding to the circuit face, and the conductive material was melted under pressure by raising the temperature to 260° C. and then cooled to room temperature, whereby the chip-shaped workpiece was fixed to the circuit board to manufacture a semiconductor device.

The flip chip bonding property on this occasion was evaluated according to the following evaluation standard.
(Evaluation Standard for Flip Chip Bonding Property)
Good: Mounting could be achieved by the flip chip bonding method with no trouble;
Poor: Mounting could not be achieved by the flip chip bonding method.
<Evaluating Method for Marking Property of Wafer Back Surface>
Laser marking was applied with YAG laser on the back surface of the chip-shaped workpiece (i.e., surface of the outermost layer of the film for semiconductor back surface) in the semiconductor device obtained by the above-mentioned <Evaluating method for flip chip bonding property>. On the information obtained by the laser marking (bar-code information), the marking property (laser marking property) of the semiconductor device obtained using the dicing tape-integrated film for semiconductor back surface according to each Example or Comparative Example was evaluated according to the following evaluation standard.
(Evaluation Standard for Marking Property)
Good: The number of persons who judged the information obtained by the laser marking satisfactorily visible was 8 persons or more among randomly selected 10 adult persons;
Poor: The number of persons who judged the information obtained by the laser marking satisfactorily visible was 7 persons or less among randomly selected 10 adult persons.
<Evaluation Method for Appearance Property of Wafer Back Surface>
On the chip-shaped workpiece according to each Example and Comparative Example obtained by the above-mentioned <Evaluating method of dicing property/picking-up property> using the dicing tape-integrated film for semiconductor back surface according to each Example and Comparative Example, the appearance property of the back surface of the chip-shaped workpiece was visually evaluated according to the following evaluation standard.
(Evaluation Standard for Appearance Property>
Good: No peeling (lifting) was observed between the back surface of the wafer (silicon wafer) and the film for semiconductor back surface in the chip-shaped workpiece;
Poor: Peeling (lifting) was observed between the back surface of the wafer (silicon wafer) and the film for semiconductor back surface in the chip-shaped workpiece.

peeling angle: 180', tensile rate: 300 mm/min) of the pressure-sensitive adhesive layer of the dicing tape to the film for semiconductor back surface is from 0.05 N/20 mm to 1.5 N/20 mm, the dicing tape-integrated film for semiconductor back surface can be utilized from the dicing step of a semiconductor wafer to the flip chip bonding step of a semiconductor chip. Namely, the dicing tape-integrated film for semiconductor back surface according to the invention can be suitably used as a dicing tape-integrated film for semiconductor back surface possessing both functions of a dicing tape and a film for semiconductor back surface at the production of semiconductor devices by flip chip bonding method.

While the present invention has been described in detail and with reference to specific embodiments thereof, it will be apparent to one skilled in the art that various changes and modifications can be made therein without departing from the scope thereof.

This application is based on Japanese patent application No. 2009-292769 filed Dec. 24, 2009 and Japanese patent application No. 2010-253088 filed Nov. 11, 2010, the entire contents thereof being hereby incorporated by reference.

What is claimed is:

1. A dicing tape-integrated film for semiconductor back surface, comprising:
    a dicing tape comprising a base material and a pressure-sensitive adhesive layer provided on the base material; and
    a film for flip chip type semiconductor back surface provided on the pressure-sensitive adhesive layer,
    wherein a peel force (temperature: 23° C., peeling angle: 180°, tensile rate: 300 mm/min) between the pressure-sensitive adhesive layer of the dicing tape and the film for flip chip type semiconductor back surface is from 0.05 N/20 mm to 1.5 N/20 mm,
    wherein the film for flip chip type semiconductor back surface is colored, and
    wherein the film for flip type semiconductor back surface is formed of a resin composition containing at least one of an epoxy resin, a phenol resin or an acrylic resin.

2. The dicing tape-integrated film for semiconductor back surface according to claim 1, wherein the film for flip chip type semiconductor back surface has a laser marking property.

TABLE 2

|  | Peel force (N/20 mm) | Dicing property | Picking-up property (%) | Flip chip bonding property | Laser marking property | Appearance property |
|---|---|---|---|---|---|---|
| Example 1 | 1.0 | Good | 100 | Good | Good | Good |
| Example 2 | 0.1 | Good | 100 | Good | Good | Good |
| Comparative Example 1 | 1.8 | Good | 85 | Good | Good | Good |
| Comparative Example 2 | 0.03 | Poor | 100 | Good | Good | Good |

From Table 2, it was confirmed that the dicing tape-integrated film for semiconductor back surface according to each of the Examples 1 and 2 possessed a function as a dicing tape and also a function as a film for semiconductor back surface at excellent levels.

In the dicing tape-integrated film for semiconductor back surface according to the invention, since the dicing tape and the film for semiconductor back surface are formed in an integrated fashion as well as a peel force (temperature: 23° C., 3. The dicing tape-integrated film for semiconductor back surface according to claim 1, which is used for a flip chip-mounted semiconductor device.

4. A flip chip-mounted semiconductor device, which is manufactured using the dicing tape-integrated film for semiconductor back surface according to claim 1, the semiconductor device comprising a chip-shaped workpiece and the film for flip chip type semiconductor back surface attached to a back surface of the chip-shaped workpiece.

5. A process for producing a semiconductor device, the process comprising:

attaching a non-circuit surface of a semiconductor wafer onto a film for flip chip type semiconductor back surface of a dicing tape-integrated film for semiconductor back surface, the dicing tape-integrated film for semiconductor back surface comprising a dicing tape comprising abuse material and a pressure-sensitive adhesive layer provided on the base material, and the film for flip chip type semiconductor back surface provided on the pressure-sensitive adhesive layer, wherein a peel force (temperature: 23° C, peeling angle: 180°, tensile rate: 300 m/min) between the pressure-sensitive adhesive layer of the dicing tape and the film for flip chip type semiconductor back surface is from 0.05 N/20 mm to 1.5 N/20 mm:

dicing the semiconductor wafer to form a semiconductor chip, peeling the semiconductor chip from the pressure-sensitive adhesive layer of the dicing tape together with the film for flip chip type semiconductor back surface attached on the non-circuit surface of the semiconductor chip; and fixing the semiconductor chip to an adherend by flip chip bonding in a form wherein a circuit surface of the semiconductor chip is opposed to the adherend and the film for flip chip type semiconductor back surface is attached on the non-circuit surface of the semiconductor chip.

* * * * *